United States Patent
Akagawa et al.

(10) Patent No.: US 11,004,891 B2
(45) Date of Patent: May 11, 2021

(54) LIGHT EMITTING DEVICE AND BACKLIGHT INCLUDING THE LIGHT EMITTING DEVICE

(71) Applicant: NICHIA CORPORATION, Anan (JP)

(72) Inventors: Seitaro Akagawa, Komatsushima (JP); Takeshi Morikawa, Tokushima (JP); Kentaro Nishigaki, Osaka (JP)

(73) Assignee: NICHIA CORPORATION, Anan (JP)

( * ) Notice: Subject to any disclaimer, the term of this patent is extended or adjusted under 35 U.S.C. 154(b) by 180 days.

(21) Appl. No.: 15/426,645

(22) Filed: Feb. 7, 2017

(65) Prior Publication Data
US 2017/0229512 A1  Aug. 10, 2017

(30) Foreign Application Priority Data

Feb. 9, 2016 (JP) .............................. JP2016-023135
Jan. 25, 2017 (JP) .............................. JP2017-011573

(51) Int. Cl.
 *H01L 27/15* (2006.01)
 *F21V 8/00* (2006.01)
(Continued)

(52) U.S. Cl.
 CPC .......... *H01L 27/156* (2013.01); *G02B 6/0068* (2013.01); *G02B 6/0073* (2013.01);
(Continued)

(58) Field of Classification Search
CPC ... H01L 27/156; H01L 33/486; H01L 33/507; H01L 25/0753; G02B 6/0073
See application file for complete search history.

(56) References Cited

U.S. PATENT DOCUMENTS 8,704,265 B2 * 4/2014 Seo .................... H05B 45/40
257/99
8,933,478 B2 * 1/2015 Tischler ................ H01L 33/508
257/98
(Continued)

FOREIGN PATENT DOCUMENTS

JP  H08-272316 A  10/1996
JP  2007-507910 A  3/2007
(Continued)

OTHER PUBLICATIONS

Senden, Tim; Relinde JA van Dijk-Moes; Meijerink, Andries. Quenching of the red Mn4+ luminescence in Mn4+-doped fluoride LED phosphors, May 2018, Light: Science and Applications; London vol. 7, p. 1-13; DOI 10.1038/s41377-018-0013-1 (Year: 2018).*

*Primary Examiner* — Rajarshi Chakraborty
*Assistant Examiner* — Michael Chiang
(74) *Attorney, Agent, or Firm* — Hunton Andrews Kurth LLP

(57) ABSTRACT

A light emitting device includes at least three light emitting elements arranged side by side, and one or more light transmissive members each containing a phosphor and covering the light emitting elements. The at least three light emitting elements include two outer light emitting elements arranged on outer sides, and an inner light emitting element arranged between the two outer light emitting elements and having a different peak emission wavelength than a peak emission wavelength of the two outer light emitting elements. The phosphor has a longer peak emission wavelength than the peak emission wavelengths of the outer light emitting elements and the peak emission wavelength of the inner light emitting element. The two outer light emitting elements and the inner light emitting element are connected in series.

15 Claims, 5 Drawing Sheets

(51) Int. Cl.
*H01L 33/48* (2010.01)
*H01L 33/50* (2010.01)
(52) U.S. Cl.
CPC .......... *H01L 33/486* (2013.01); *H01L 33/507* (2013.01); *H01L 33/502* (2013.01); *H01L 2224/48137* (2013.01); *H01L 2924/181* (2013.01)

(56) References Cited

U.S. PATENT DOCUMENTS

| | | | | |
|---|---|---|---|---|
| 2004/0104391 A1* | 6/2004 | Maeda | ................ | C09K 11/025 257/79 |
| 2007/0001188 A1* | 1/2007 | Lee | ................ | H01L 25/0753 257/99 |
| 2007/0126011 A1 | 6/2007 | Lee | | |
| 2008/0061674 A1* | 3/2008 | Chen | ................ | C09K 11/661 313/485 |
| 2008/0258602 A1* | 10/2008 | Masuda | ................ | H01L 33/507 313/487 |
| 2008/0266893 A1* | 10/2008 | Speier | ................ | F21V 5/04 362/551 |
| 2010/0066943 A1* | 3/2010 | Akiba | ................ | G02B 6/0073 349/62 |
| 2010/0123386 A1* | 5/2010 | Chen | ................ | H01L 33/58 313/502 |
| 2012/0195020 A1* | 8/2012 | Cha | ................ | H01L 25/0753 362/84 |
| 2012/0230024 A1 | 9/2012 | Moore | | |
| 2012/0274878 A1 | 11/2012 | Kunz et al. | | |
| 2015/0001559 A1 | 1/2015 | Sasaoka et al. | | |
| 2015/0179895 A1* | 6/2015 | Herner | ................ | H01L 27/156 257/89 |
| 2015/0184811 A1 | 7/2015 | Moore | | |
| 2016/0087166 A1* | 3/2016 | Chang | ................ | H01L 27/15 257/89 |
| 2016/0116140 A1* | 4/2016 | Eguchi | ................ | H01L 25/0753 362/293 |
| 2016/0308104 A1 | 10/2016 | Sasaoka et al. | | |
| 2016/0360956 A1 | 12/2016 | Moore | | |
| 2017/0156187 A1 | 6/2017 | Yamashita | | |

FOREIGN PATENT DOCUMENTS

| | | |
|---|---|---|
| JP | 2007-158296 A | 6/2007 |
| JP | 2010-118629 A | 5/2010 |
| JP | 2012-069572 A | 4/2012 |
| JP | 2013-515366 A | 5/2013 |
| JP | 2014-514685 A | 6/2014 |
| JP | 2015-029052 A | 2/2015 |
| JP | 2015-060972 A | 3/2015 |
| JP | 2015-176967 A | 10/2015 |
| WO | 2015-156175 A1 | 10/2015 |

\* cited by examiner

LIGHT EMITTING DEVICE AND BACKLIGHT INCLUDING THE LIGHT EMITTING DEVICE

CROSS-REFERENCE TO RELATED APPLICATIONS

This application claims priority to Japanese Patent Application No. 2016-023135; filed on Feb. 9, 2016 and Japanese Patent Application No. 2017-011573, filed on Jan. 25, 2017, the disclosures of which are hereby incorporated by reference in their entirety.

BACKGROUND

The present disclosure relates to light emitting devices and backlights including the light emitting devices.

In general, light emitting devices using light emitting elements, such as light emitting diodes (LEDs), are widely utilized as various light sources, including liquid crystal display backlights, LED light bulbs or LED light tubes, and lighting fixtures such as ceiling lights.

For example, the light emitting device disclosed in Japanese Unexamined Patent Application Publication No. 2007-158296 includes a red phosphor, a light emitting element that emits blue light, and a light emitting element that emits green light. This is described to achieve a high level of color reproducibility as a light emitting device for use in a liquid crystal display backlight.

SUMMARY

The light emitting device disclosed in the above patent document, however, may have color non-uniformity because the light emitted from the light emitting elements intensely travels in straight lines as compared to a light emitting device which includes a green phosphor.

An object of the present disclosure is to provide a light emitting device with reduced color non-uniformity.

The light emitting device according to the present disclosure includes at least three light emitting elements arranged side by side, and one or more light transmissive members each containing a phosphor and covering the light emitting elements. The at least three light emitting elements include two outer light emitting elements arranged on outer sides, and an inner light emitting element disposed between the two outer light emitting elements and having a different peak emission wavelength than a peak emission wavelengths of the two outer light emitting elements. The phosphor has a longer peak emission wavelength than the peak emission wavelengths of the outer light emitting elements and the peak emission wavelength of the inner light emitting elements. The two outer light emitting elements and the inner light emitting element are connected in series.

The present disclosure can provide a light emitting device with reduced color non-uniformity.

DETAILED DESCRIPTION

Figure 1A:
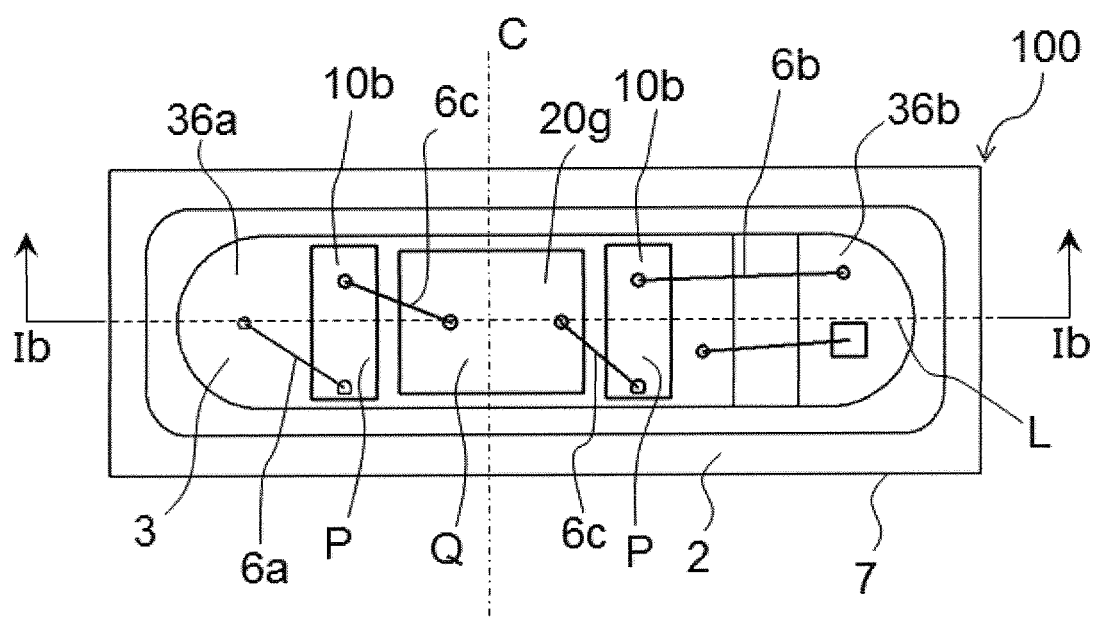
FIG. 1A is a schematic top view of a light emitting device according to a first embodiment (Embodiment 1).

Certain embodiments of the present disclosure will be explained in detail below based on the drawings. In the explanations below, terms indicating certain directions and positions will be used as needed, for example, "upper," "lower," and terms including these. These terms are used for the purpose of making the invention easily understood based on the drawings being referred to, and the technical scope of the invention should not be limited by the meanings of these terms. The portions and components denoted by the same reference numerals appearing in multiple drawings represent the same portions or components.

The embodiments described below exemplify the light emitting devices for the purpose of embodying the technical ideas of the present disclosure, and the present disclosure is not limited to those described below. The sizes, materials, shapes, and the relative positions of the constituent members disclosed in the embodiments, unless otherwise specified, are not intended to limit the scope of the invention, but are provided for exemplification purposes. The sizes and positional relationships of the members illustrated in each drawing might be exaggerated to assist in understanding the invention. The relationships between color names and chromaticity coordinates, the relationships between wavelength ranges of light and monochromatic light color names, and the like, are in accordance with JIS Z 8110.

The light emitting devices according to the present disclosure include at least three light emitting elements arranged side by side, and one or more light transmissive members containing a phosphor. The at least three light emitting elements include two outer light emitting elements disposed on outer sides, and an inner light emitting element disposed on an inner side of the two outer light emitting elements. The two outer light emitting elements and the inner light emitting element are connected in series.

The light emitting devices constructed as above, according to the present disclosure, can achieve good color mixture of the light emitted from each light emitting element and the light re-emitted from the phosphor, which is excited by the light emitted from the light emitting elements, thereby reducing color non-uniformity of the light emitting devices.

The light emitting devices according to the embodiments of the present disclosure will be explained in detail below.

1. Embodiment 1

Figure 1B:
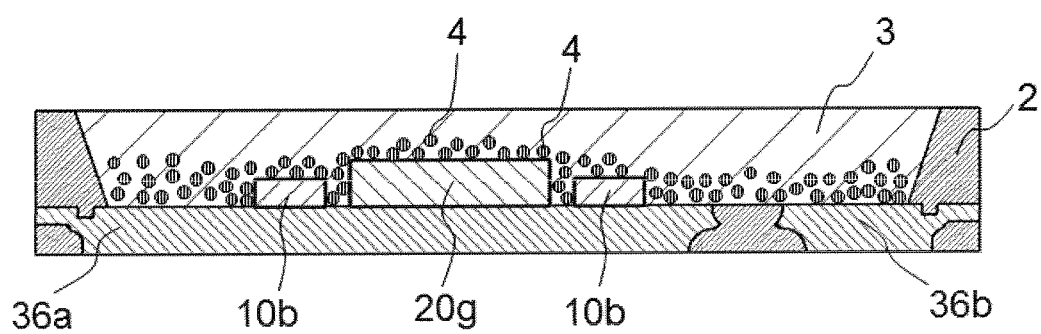
FIG. 1B is a schematic sectional view of the light emitting device of FIG. 1A.

FIG. 1A is a schematic top view of a light emitting device 100, and FIG. 1B is a schematic sectional view taken along line Ib-Ib indicated in FIG. 1A. In FIG. 1A, the phosphor 4 is omitted so that outer light emitting elements P and an inner light emitting element Q disposed in the light transmissive member 3 can be easily illustrated.

In the light emitting device 100, the two outer light emitting elements P and the inner light emitting element Q are arranged side by side on an upper surface of a first lead 36a arranged on a bottom surface of a recess of a resin package 2. The inner light emitting element Q is disposed on the inner sides of the two outer light emitting elements P. The light emitting elements are preferably equally spaced, but are not required to be so.

Being "arranged side by side" herein refers to arranging at least three light emitting elements linearly, in other words, at least certain lateral respective surfaces of adjacent light emitting elements face one another. The "outer light emitting elements" herein refers to, among a plurality of light emitting elements arranged side by side, the light emitting elements that are positioned at the ends. There may be one outer light emitting element P disposed at one end, or there may be two or more. In the case where there are two or more outer light emitting elements P at one end, the two or more outer light emitting elements P emit light of the same color. More specifically, in the case where the outer light emitting elements P are blue light emitting elements, those having a peak emission wavelength in a range from 430 nm to less than 490 nm are used. When arranging two or more outer light emitting elements P at one end, for example, the two or more outer light emitting elements P may be arranged along the layout direction L in which the plurality of light emitting elements are arranged side by side, or may be arranged perpendicular to the layout direction L. The "inner light emitting element" refers to the light emitting element interposed between the outer light emitting elements P. It suffices for the inner light emitting element Q to be interposed between at least two outer light emitting elements P, not necessarily requiring for it to be the center of the plurality of light emitting elements or be positioned in the center of the bottom surface of the recess. There may be one inner light emitting element Q, or two or more. When there are two or more inner light emitting elements Q, the two or more inner light emitting elements Q emit light of the same color. More specifically, in the case where the inner light emitting elements Q are green light emitting elements, those having a peak emission wavelength in a range between 490 nm and 570 nm are used. When there are two or more inner light emitting element Q, for example, the inner light emitting elements Q may be arranged along the layout direction L of the plurality of light emitting elements arranged side by side, or may be arranged perpendicular to the layout direction L.

In the light emitting device 100 shown in FIG. 1A and FIG. 1B, blue light emitting elements, denoted as first light emitting elements 10b, are used for the outer light emitting elements P, and a green light emitting element, denoted as a second light emitting element 20g, is used for the inner light emitting element Q.

Figure 2:
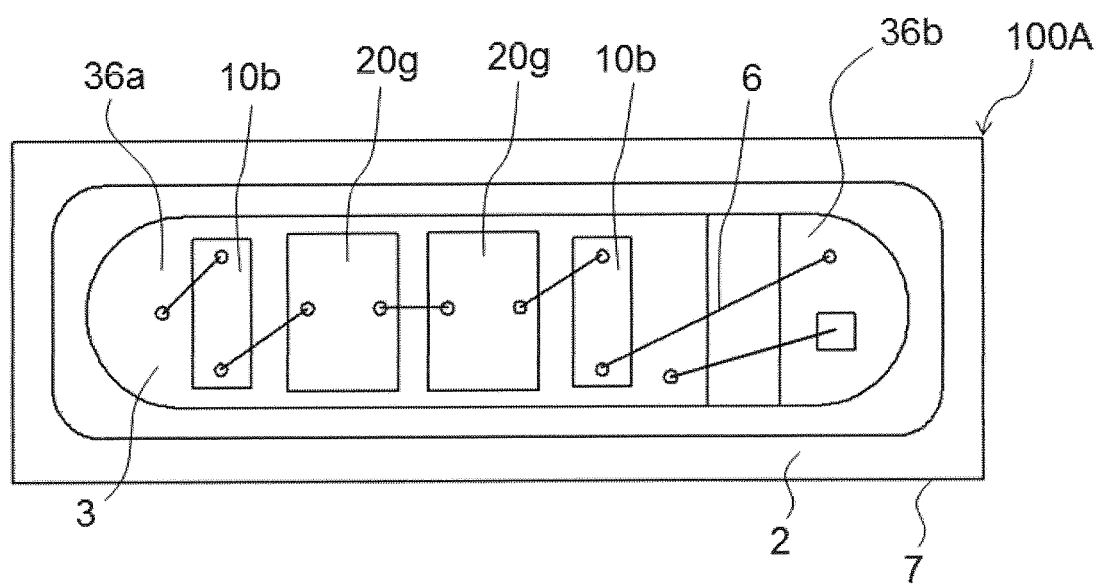
FIG. 2 is a schematic top view of a variation of the light emitting device of FIG. 1A.

The light emitting device 100 may have three or more outer light emitting elements P, and two or more inner light emitting elements Q, in accordance with an amount of light to be achieved. In the embodiment shown in FIG. 1A, a first light emitting element 10b, a second light emitting element 20g, and another first light emitting element 10b are arranged side by side in this order from the left. In the embodiment shown in FIG. 1A, blue light emitting elements are used as the outer light emitting elements P, and a green light emitting element as the inner light emitting element Q without limitation. Green light emitting elements may be used as the outer light emitting elements P, and a blue light emitting element may be used as the inner light emitting element Q. Moreover, depending on the emission properties to be achieved, the number of the first emitting elements 10b may be larger than the number of the second light emitting elements 20g, the number of the second light emitting elements 20g may be larger than the number of the first emitting elements 10b, or the numbers of the first emitting elements 10b and the second light emitting elements 20g may be equal. A light emitting device 100A shown in FIG. 2 includes two first light emitting elements 10b and two second light emitting elements 20g, in which the two second light emitting elements 20g are arranged on the inner sides of the two first light emitting elements 10b. Adjusting the number of light emitting elements in this manner can produce a light emitting device achieving a given color and an amount of light.

The peak emission wavelength of the first light emitting element 10b is in a range from 430 nm to less than 490 nm, in other words, the wavelength range of the blue region, preferably in a range between 440 nm and 470 nm. The peak emission wavelength of the second light emitting element 20g is in a range between 490 nm and 570 nm, in other words, the wavelength range of the green region, preferably in a range between 520 nm and 550 nm. For the second light emitting element 20g, in particular, it is preferable to use a light emitting element having a full width at half maximum of 40 nm or lower, more preferably 30 nm or lower. This allows for the green light to have a sharp peak as compared to the green light obtained by using a green phosphor. As a result, the liquid crystal display device including the light emitting device 100 can achieve a high level of color reproducibility.

The first light emitting elements 10b and the second light emitting element 20g are individually electrically connected to an external circuit, for example, a wiring layer on the mounting substrate, and emit light by the power supplied via the external circuit. In the light emitting device 100 shown in FIG. 1A, one of the positive and negative electrodes of the first light emitting element 10b arranged at one end is connected to the first lead 36a via a wire 6a, while one of the positive and negative electrodes of the other first light emitting element 10b arranged at the other end is connected to the second lead 36b via a wire 6b. The second light emitting element 20g arranged on the inner side is electrically connected to the adjacent first light emitting elements 10b via wires 6c. In the light emitting device 100 shown in FIG. 1A, the first light emitting element 10b arranged at one end, the second light emitting element 20g arranged on the inner side, and the other first light emitting element 10b arranged at the other end are connected in this order in series.

In the light emitting device 100, a resin package 2 is used as a support 7. The support herein refers to a member for placing the first light emitting elements 10b and the second light emitting element 20g, such as a resin package or a ceramic substrate, which includes, for example, conductive members for supplying power to the light emitting elements. The conductive members are disposed on the surface of the support 7 using, for example, leads or a wiring layer.

In the light emitting device 100 shown in FIG. 1A and FIG. 1B, a light transmissive member 3 is disposed in the recess of the resin package 2. The light transmissive member 3 may be made of, for example, a resin or glass. The light transmissive member 3 contains a phosphor 4 having a longer peak emission wavelength than the peak emission wavelengths of the outer and inner light emitting elements. In the light emitting device 100 shown in FIG. 1B, a phosphor 4 having a peak emission wavelength in a range between 580 nm and 680 nm is used. The phosphor 4 absorbs a portion of the blue light emitted by the first light emitting elements 10b and re-emits red light. In other words, the phosphor 4 converts blue light into red light having a different wavelength from blue light.

It is preferable to use the phosphor 4 that is less likely to absorb the green light of the second light emitting element 20g and re-emit red light. In other words, it is preferable for the phosphor 4 to not substantially convert green light into red light. The reflectance of the phosphor 4 for green light is preferably 70% or higher on the average over the green light wavelength range. Employing a phosphor having a high reflectance for green light, in other words, a phosphor less likely to absorb green light or a phosphor less likely to convert the wavelength of green light, can facilitate the design of the light emitting device.

If a red phosphor that readily absorbs green light were used as the phosphor 4, one would have to consider the output balance of the light emitting device by taking into account the wavelength conversion with respect to not only the first light emitting elements 10b, but also the second light emitting element 20g. On the other hand, using a phosphor 4 which less likely to convert the wavelengths of green light allows one to design the output balance of the light emitting device by taking only the wavelength conversion of the blue light emitted by the first light emitting elements 10b into consideration.

Examples of such preferable phosphors 4 include the red phosphors described below. The phosphor 4 includes at least one of these.

A first type of red phosphor is one having the composition expressed by the general formula (I) below.

$$A_2MF_6:Mn^{4+} \quad (I)$$

In the general formula (I), A is at least one selected from the group consisting of K, Li, Na, Rb, Cs, and $NH_4^+$, and M is at least one selected from the group consisting of the elements of Group 4 and Group 14.

The elements of Group 4 are titanium (Ti), zirconium (Zr), and hafnium (Hf). The elements of Group 14 are silicon (Si), germanium (Ge), tin (Sn), and lead (Pb).

Specific examples of the first type of red phosphors include $K_2SiF_6:Mn^{4+}$, $K_2(Si,Ge)F_6:Mn^{4+}$, and $K_2TiF_6:Mn^{4+}$.

A second type of red phosphor is one with the composition represented by formula $3.5MgO.0.5MgF_2.GeO_2:Mn^{4+}$, or the composition represented by the following general formula (II):

$$(x-a)MgO.a(Ma)O.b/2(Mb)_2O_3.yMgF_2.c(Mc)X_2.(1-d-e)GeO_2.d(Md)O_2.e(Me)_2O_3:Mn^{4+} \quad (II)$$

where, in the general formula (II), Ma is at least one element selected from Ca, Sr, Ba and Zn; Mb is at least one element selected from Sc, La, and Lu; Mc is at least one element selected from Ca, Sr, Ba, and Zn; X is at least one element selected from F and Cl; Md is at least one element selected from Ti, Sn, and Zr; and Me is at least one element selected from B, Al, Ga, and In. Furthermore, x, y, a, b, c, d, and e are set to satisfy the following ranges: $2 \leq x \leq 4$; $0 < y \leq 2$; $0 \leq a \leq 1.5$; $0 \leq b < 1$; $0 \leq c \leq 2$; $0 \leq d \leq 0.5$; and $0 \leq e < 1$.

The light transmissive member 3 covers at least a portion of the first light emitting elements 10b and at least a portion of the second light emitting element 20g. The light transmissive member 3 is also disposed so that at least one portion thereof is positioned between the first light emitting elements 10b and the second light emitting element 20g. Preferably, the light transmissive member 3 is disposed so as to straddle the first light emitting elements 10b and the second light emitting element 20g, and to be in contact with them. As shown in FIG. 1A and FIG. 1B, the surfaces of the first light emitting elements 10b other than the bottom surfaces mounted on the first lead 36a or the second lead 36b, in other words, the upper and lateral surfaces, may substantially entirely be covered by the light transmissive member 3. Similarly, the surfaces of the second light emitting element 20g other than the bottom surface in contact with the first lead 36a or the second lead 36b, in other words, the upper and lateral surfaces, may substantially entirely be covered by the light transmissive member 3.

By covering the first light emitting elements 10b with the light transmissive member 3, a portion of the blue light emitted from the first light emitting elements 10b is absorbed by the phosphor 4 in the light transmissive member 3, and the phosphor 4 emits red light. The blue light not wavelength-converted by the phosphor 4 and the red light re-emitted by the phosphor 4 pass through the light transmissive member 3 to externally exit from the upper surface of the light transmissive member 3 which is the light extraction surface of the light emitting device 100. The green light emitted from the second light emitting element 20g passes through and exits from the upper surface of the light transmissive member 3 after a portion thereof has undergone wavelength conversion into red light, preferably without being or less likely to be converted by the phosphor 4 into red light. The blue light, the red light, and the green light are mixed, thereby producing light of a given color, for example, white light.

Furthermore, a portion of the green light emitted from the second light emitting element 20g, preferably, is scattered by the phosphor 4 without undergoing a wavelength conversion. In this case, the intensity distribution of the green light emitted from the light emitting device 100 becomes uniform, thereby reducing the occurrences of color non-uniformity. It is also convenient from a perspective of productivity, for example, to use the same resin to form the light transmissive member 3 serving as an encapsulating resin, which covers the first light emitting elements 10b and the second light emitting element 20g.

The constituent elements of the light emitting device 100 will be explained in detail below.

Light Emitting Element

A preferable layout of the first light emitting elements 10b and the second light emitting element 20g will be exemplified below.

As shown in FIG. 1A, the layout direction L for the two first light emitting elements 10b and the second light emitting element 20g arranged side by side may be parallel to the longitudinal direction of the support 7, in other words, the lateral direction in FIG. 1A and FIG. 1B. The layout direction L for the two first light emitting elements 10b and the second light emitting element 20g may be parallel to the longitudinal direction of the light emitting element mounting surface of the support 7. The light emitting element mounting surface of the support 7 herein is the surface of the support 7 on which the light emitting elements are mounted. In FIG. 1A and FIG. 1B, the light emitting element mounting surface refers to the entire surface of the first lead 36a exposed at the bottom surface of the recess. Arranging them in this manner allows for the light emitted from the light emitting elements to be more uniformly scattered across the entire light emitting device 100.

In the light emitting device 100, the second light emitting element 20g is interposed between two first light emitting elements 10b. Arranging them in this manner facilitates mixing of the light emitted from the second light emitting element 20g and the light from the two first light emitting elements 10b located on the outer sides of the second light emitting element 20g. This, as a result, can further reduce the occurrences of color non-uniformity. The distance between the facing lateral surfaces of the first light emitting element 10b and the second light emitting element 20g is preferably in a range between 10 μm and 300 μm, more preferably in a range between 50 μm and 150 μm. As such, the first light emitting elements 10b and the second light emitting element 20g can be arranged close to one another, further improving the color mixing properties of the light emitting device.

In the light emitting device 100, the distance between the first light emitting element 10b located on the left side and the second light emitting element 20g is set substantially equal to the distance between the first light emitting element 10b located on the right side and the second light emitting element 20g. When a plurality of first light emitting elements 10b and a plurality of the second light emitting elements 20g are provided, it is preferable for the light emitting elements to be equally spaced. The plurality of light emitting elements are preferably arranged so as to be symmetrical about the center line C, which is perpendicular to the layout direction L, as a line of symmetry. In the light emitting device 100 shown in FIG. 1A, the two first light emitting elements 10b and the second light emitting element 20g are arranged to be symmetrical about the center line C. By arranging the plurality of light emitting elements, including the first light emitting elements 10b and the second light emitting element 20g, to be symmetrical about the center line C, the light emitting elements can be equally spaced, and the areas of the emission surfaces of the plurality of light emitting elements on the right and the left can be made equal in a plan view. Arranging them in this manner can reduce the occurrences of color non-uniformity of the light emitting device.

In the case where a light emitting device has the luminous intensity distribution desirable for a certain application, the spacings between the light emitting elements may differ.

Multiple rows of light emitting elements, each row having at least three light emitting elements, including two first light emitting elements 10b and a second light emitting element 20g arranged side by side, may be provided. In other words, at least three light emitting elements, including two first light emitting elements 10b and a second light emitting element 20g, are arranged along a straight line, and another set of at least three light emitting elements, including two other first light emitting elements 10b and another second light emitting element 20g, can be arranged along another straight line.

The preferable arrangements discussed above can be used in any combination.

The first light emitting elements 10b and the second light emitting element 20g may be semiconductor elements, for example, light emitting diodes (LEDs), that emit light by applying a voltage. For the semiconductors used for the light emitting elements, nitride-based semiconductors ($In_XAl_YGa_{1-X-Y}N$, $0 \leq X$, $0 \leq Y$, $X+Y \leq 1$), or the like can be used. In other words, the first light emitting elements 10b and the second light emitting element 20g may be nitride semiconductor elements. The shapes of the first light emitting elements 10b and the second light emitting element 20g can be a square or rectangle, and a plurality of these can be arranged in combination. The numbers and shapes of the light emitting elements can be suitably selected in accordance with the shape and size of the support 7.

Figure 3A:
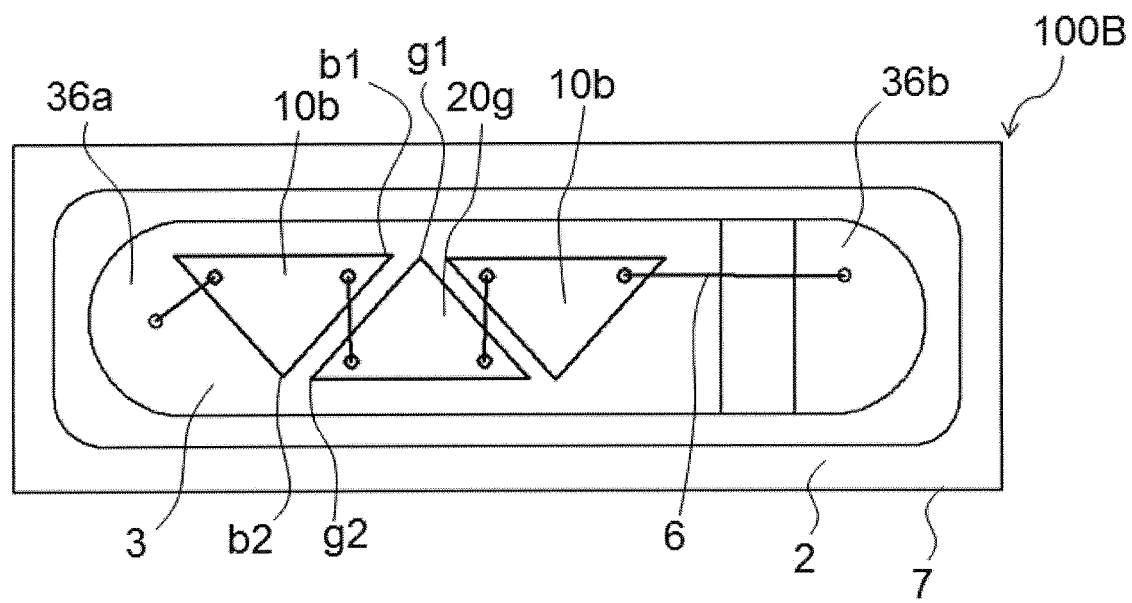
FIG. 3A is a schematic top view of a variation of the light emitting device of FIG. 1A.
Figure 3B:
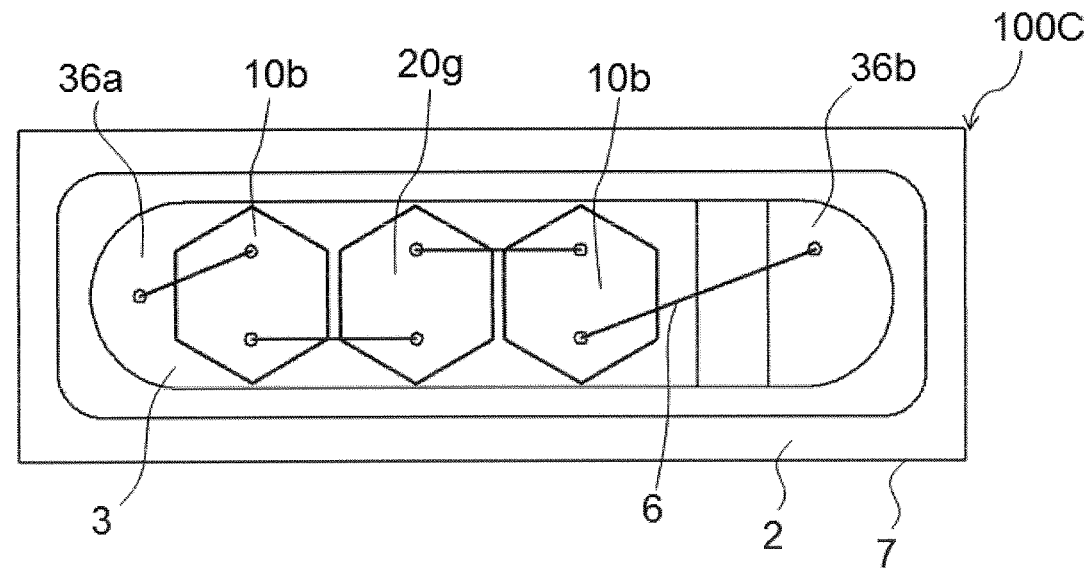
FIG. 3B is a schematic top view of a variation of the light emitting device of FIG. 1A.

As shown in FIG. 3A and FIG. 3B, examples of the planar shapes of the light emitting elements include triangles and hexagons. In a light emitting device 100B shown in FIG. 3A, the light emitting elements are arranged so that the lateral surfaces of the first light emitting elements 10b facing the second light emitting element 20g are in parallel to the lateral surfaces of the second light emitting element 20g facing the first light emitting elements 10b. In other words, the first light emitting elements 10b and the second light emitting element 20g are arranged so that the areas formed by b1, b2, g1, and g2 between the first light emitting elements 10b and the second light emitting element 20g are substantially parallelograms. Similarly, in a light emitting device 100C shown in FIG. 3B, the light emitting elements are arranged so that the lateral surfaces of the first light emitting elements 10b facing the second light emitting element 20g are parallel to the lateral surfaces of the second light emitting element 20g facing the first light emitting elements 10b. Using such light emitting elements can increase the percentage of the light emitting element mounting surface of the support 7 occupied by the light emitting elements, thereby producing a light emitting device resulting in good light extraction.

The light output of the first light emitting elements 10b may be the same as the light output of the second light emitting element 20g. Depending on the properties to be achieved, such as color reproducibility, the light output of the first light emitting elements 10b may differ from the light output of the second light emitting element 20g. As an embodiment for achieving good color reproducibility, the ratio of the light output of the second light emitting element 20g to the light output of the first light emitting element 10b can be set to a range between 0.3 and 0.7. A ratio of the sum of light output from all the first light emitting element 10b used in the light emitting device can be set to a range between 0.2 and 0.6 with respect to light output from all the second light emitting elements 20g used in the light emitting device.

The "light output" herein refers to the radiant flux specified in JIS Z 8113. The light output ratio of the light emitting elements can be obtained by measuring the emission spectra using a spectrophotometer, and calculating it based on the integral value ratio of the emission spectra of the blue light emitting element and the green light emitting element. The light output of a light emitting element is determined by the peak emission wavelength of the light emitting element, the planar area of the light emitting element, or the type of the semiconductor stack of the light emitting element.

In the light emitting device 100 shown in FIG. 1B, the upper surface of the second light emitting element 20g is positioned higher than the upper surfaces of the first light emitting elements 10b. That is, the upper surface of the second light emitting element 20g is positioned closer to the light extraction surface of the light emitting device 100, which is the upper surface of the light transmissive member 3, than the upper surfaces of the first light emitting elements 10b. The upper surface height difference between the first light emitting elements 10b and the second light emitting element 20g is, for example, in a range between 50 μm and 150 μm, preferably in a range between 100 μm and 120 μm. Such arrangement can achieve good color reproducibility even in the case, for example, where the light output of the second light emitting element 20g is lower than the light output of the first light emitting elements 10b to some extent. The arrangement, however, can be appropriately selected from other than above, for example, the upper surface of the second light emitting element 20g may be positioned lower than the upper surfaces of the first light emitting elements 10b, or the upper surfaces of the first light emitting elements 10b may be positioned at the same height as the upper surface of the second light emitting element 2g.

Light Transmissive Member

The light transmissive member 3 is formed using a given material, such as a resin or a glass material, and contains the phosphor 4. If a resin is used to form the light transmissive member 3, a resin appropriately selected can be used. Examples of suitable resins include silicone-based resins and epoxy-based resins. The light transmissive member 3 can be formed by mixing and dispersing the phosphor 4 in such a resin in a molten state, supplying the resin in the recess of package 2 with the phosphor-dispersed resin, and curing the resin.

Furthermore, the light transmissive member 3 can contain a diffusing agent, such as $TiO_2$ or $SiO_2$. This can sufficiently diffuse the light emitted by the first light emitting elements 10b, the second light emitting element 20g, and the phosphor 4.

Support

The resin package 2, which is one form of a support 7, can be formed with a given resin. Thermosetting resins, thermoplastic resins, or the like can be used. Examples of preferable resins include nylon-based resins, epoxy-based resins, silicone-based resins, and polyester-based resins, such as unsaturated polyesters.

A light reflective material such as plated metal, for example, silver (Ag), may be disposed, or a highly light reflective member may be formed, on the surface of the recess of the resin package 2 as needed. This can improve light reflectivity of surfaces in the recess, thereby allowing more light reaching the recess surface in the direction of projection to be reflected. As a result, light extraction efficiency of the light emitting device 100 can be further increased.

In place of the resin package having a recess, a support made of, for example, a ceramic, a resin, a dielectric material, glass, or a composite of these having connection terminals disposed on the surface thereof can be used.

After mounting the first light emitting elements 10b and the second light emitting element 20g on the support, the light transmissive member 3 containing a phosphor 4 can be formed so as to cover the first light emitting elements 10b and the second light emitting element 20g by, for example, potting.

Figure 4A:
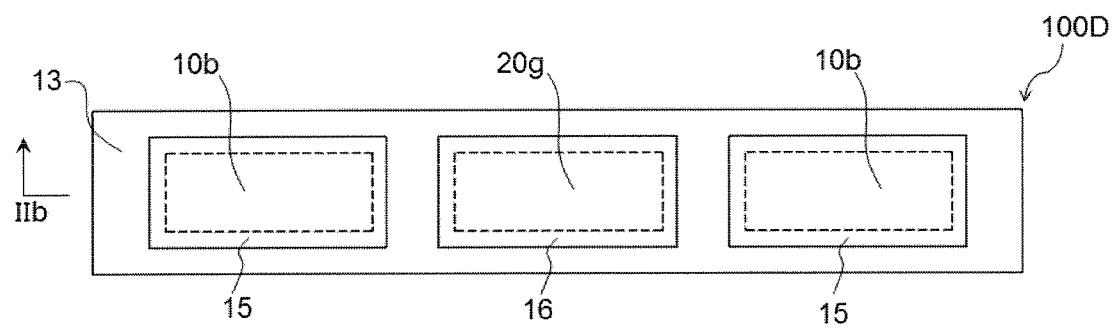
FIG. 4A is a schematic top view of a variation of the light emitting device of FIG. 1A.
Figure 4B:
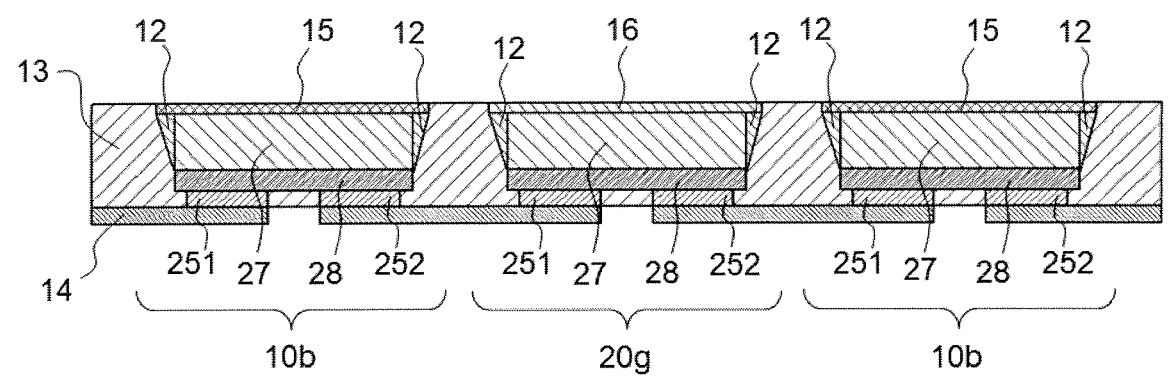
FIG. 4B is a schematic sectional view of the light emitting device of FIG. 4A.

A variation of the light emitting device 100, which does not include a support, is exemplified as a light emitting device 100D in FIG. 4A and FIG. 4B. The light emitting device 100D shown in FIG. 4A and FIG. 4B includes two first light emitting elements 10b, a second light emitting element 20g, first light transmissive members 12 disposed on the lateral surfaces of each light emitting element, and a covering member 13 covering the outer surfaces of the first light transmissive members 12. Second light transmissive members 15 and a third light transmissive member 16 each containing a phosphor 4 can be disposed on the upper surfaces of the light emitting device 100D which function as the emission surfaces. A material having a high transmittance is used for the first transmissive members 12, the second transmissive members 15, and the third transmissive member 16. The first transmissive members 12 and the third transmissive member 16 preferably contain substantially no light diffusing agent in order to efficiently transmit the light from the light emitting elements.

The first light emitting elements 10b shown in FIG. 4B include a light transmissive substrate 27, a semiconductor stack 28, and a pair of electrodes 251 and 252, wherein the light transmissive substrate 27 is positioned on the upper surface side of the first light emitting elements 10b, and the semiconductor stack 28 is positioned on the lower surface side of the first light emitting elements 10b. The pair of electrodes 251 and 252 are exposed from the covering member 13 at the lower surface of the light emitting device 100D.

The covering member 13 covers outer surfaces of the first light transmissive members 12 disposed on the lateral surfaces of each light emitting element, and the exposed portions of the lateral surfaces of each light emitting element. The covering member 13 is formed of a material which satisfies a predetermined relationship with the first light transmissive members 12 and each light emitting element in terms of the thermal expansion coefficients. Specifically, a material is selected for the covering member 13 that satisfies $\Delta T40 < \Delta T30$, when comparing the thermal expansion coefficient difference between the first light transmissive members 12 and each light emitting element (referred to as the "first thermal expansion coefficient difference $\Delta T30$") to the thermal expansion coefficient difference between the covering member 13 and each light emitting element (referred to as the "second thermal expansion coefficient difference $\Delta T40$"). This can reduce pealing of the first transmissive members 12 from the light emitting elements.

For the resin materials usable as the covering member 13, thermosetting light transmissive resins, such as silicone resins, silicone-modified resins, epoxy resins, and phenol resins are particularly preferable. The covering member 13 can be formed using a light reflective resin. The light reflective resin means a resin material which reflects 70% or more of the light from the light emitting elements. Light reaching the covering member 13 can be reflected to travel towards the upper surface (i.e., the emission surface) of the light emitting device 100D, thereby increasing the light extraction efficiency of the light emitting device 100D.

The first light transmissive member 12 covers the lateral surfaces of each light emitting element, and guides the light from the lateral surfaces towards the upper surface of the light emitting device 100D. In other words, the first light transmissive members 12 may reduce degradation of light that reaches the lateral faces of each light emitting element to be reflected at the lateral surfaces. Therefore, the light can be efficiently extracted from the light emitting elements. For the first light transmissive members 12, those materials exemplified for the light emitting device 100 can be used, and particularly, thermosetting light transmissive resins, such as silicone resins, silicone-modified resins, epoxy resins, and phenol resins are preferable. The materials exemplified for the first light transmissive members 12 can be also used for the second light transmissive members 15 and the third light transmissive member 16. The first light transmissive members 12 is in contact with the lateral surfaces of the light emitting elements, and thus are readily affected by the heat generated by the light emitting elements when they are turned on. Thermosetting resins are highly heat resistant, and thus are suited for the first light transmissive members 12. It is preferable for the first light transmissive members 12 to have a high light transmissivity. For this purpose, it is preferable for the first light transmissive members 12 to not normally contain any additives that reflect, absorb, or scatter light. However, there might be occasions where adding additives to the first light transmissive members 12 would be preferable in order to impart certain desirable characteristics. For example, various fillers can be added in order to adjust the refractive index of the first transmissive members 12, or adjust the viscosity of the first transmissive members 12 before curing.

In the light emitting device 100D shown in FIG. 4A and FIG. 4B, the second light transmissive members 15 containing a phosphor 4 is disposed on the upper surfaces, which function as the emission surfaces, of the first light emitting elements 10b, while the third light transmissive member 16 is disposed on the upper surface, which functions as the emission surface, of the second light emitting element 20g. It is preferable for the third light transmissive member 16 disposed on the upper surface of the second light emitting element 20g to not contain additives that reflect, absorb, or scatter the light emitted from the second light emitting element 20g. Arranging them in this manner can mix the colors of the light emitted from the first light emitting elements 10b, the second light emitting element 20g, and the phosphor 4, thereby achieving light of a given color, for example, white light. As shown in FIG. 4B, moreover, the first light emitting elements 10b and the second light emitting element 20g are connected in series using metal films 14 formed by, for example, sputtering. Providing such metal films 14 can efficiently dissipate heat from the light emitting elements to the outside.

The light emitting device 100 can be produced by the manufacturing method described below.

After placing a first lead 36a and a second lead 36b in a die, resin is supplied into the die to obtain a resin package 2 integrating the resin portion, the first lead 36a, and the second lead 36b. Two first light emitting elements 10b and a second light emitting element 20g are arranged on the first lead 36a exposed at the bottom surface of the recess of the resin package 2. Subsequently, as shown in FIG. 1A, the first lead 36a and the first light emitting element 10b located on the left side, the same first light emitting element 10b and the second light emitting element 20g, the second light emitting element 20g and the first light emitting element 10b located on the right side, and the same first light emitting element 10b and the second lead 36b are respectively connected using wires 6a, 6b, and 6c.

Then a molten resin containing a phosphor 4 is supplied into the recess of the resin package 2 so that at least a portion of the resin comes into contact with the first light emitting elements 10b and the second light emitting element 20g. After allowing the phosphor 4 to settle, the resin is cured to form the light transmissive member 3.

The light emitting device 100 explained above is known as a top view type light emitting device having the upper surface as the light extraction surface, and the lower surface as the mounting surface. The light emitting devices according to the present disclosure can also be applied to a so-called side view type light emitting device having the surface adjacent to the light extraction surface as the device mounting surface and emitting light in the direction parallel to the device mounting.

2. Embodiment 2

Figure 5A:
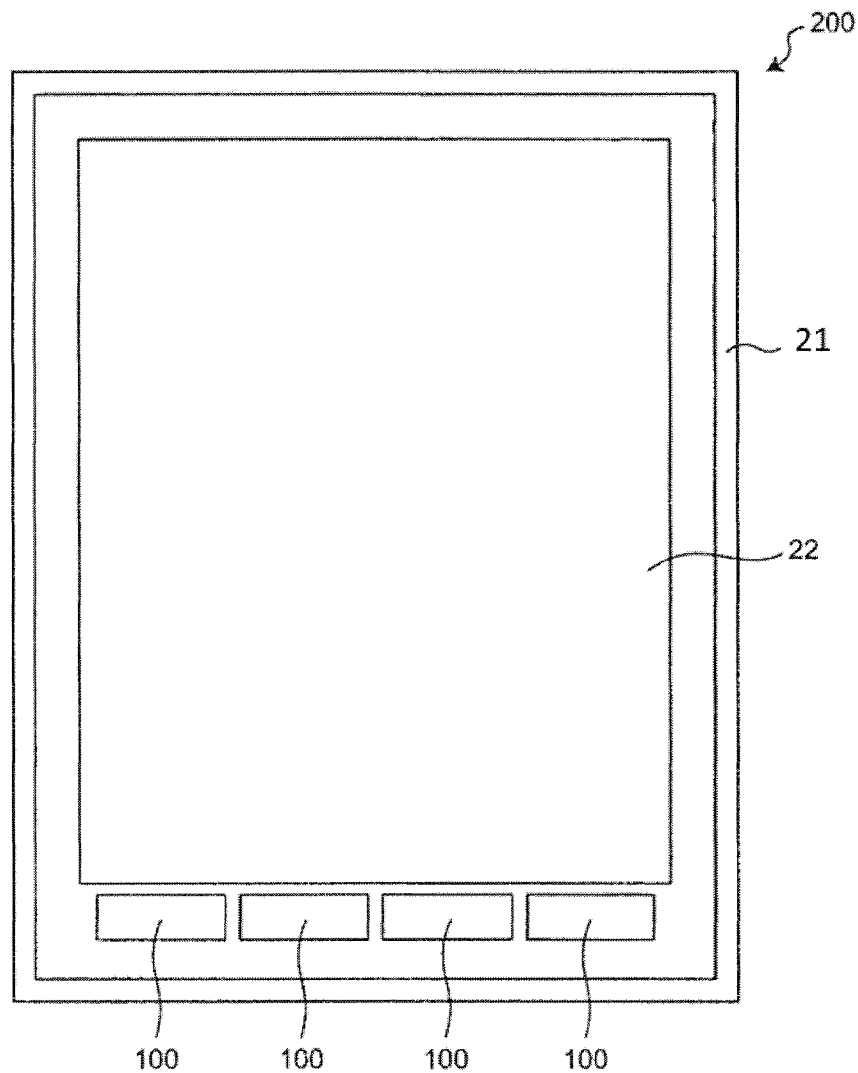
FIG. 5A is a schematic top view of a backlight according to a second embodiment (Embodiment 2).

FIG. 5A is a schematic top view of the backlight 200 according to Embodiment 2. The backlight 200 includes a plurality of the light emitting devices 100, as described below. However, the light emitting devices 100 used in the description below may be replaced with any of the light emitting devices 100A to 100D.

The backlight 200 has a case 21, a light guide plate 22 disposed in the case 21, and light emitting devices 100 placed in the case 21 and emitting light towards the light guide plate 22. The backlight 200 projects light from the light emitting devices 100 against a given device, for example, a liquid crystal panel, via the light guide plate 22.

The case 21 can have a light reflective inner surface. For example, the inner surface can be made white.

At least one of four lateral surfaces of the light guide plate 22 is used as a surface on which light from the light emitting devices 100 is incident (i.e., the light entering portion). In the embodiment shown in FIG. 5A, the lateral surface located at the bottom of the figure is the surface on which light is incident. The light emitting devices 100 are oriented so that their light extraction surfaces face the surface of the light guide plate 22 on which light is incident. Preferably, a plurality of light emitting devices 100 are arranged along the surface of the light guide plate 22 on which light is incident. The light emitted from the light emitting devices 100 enters the light guide plate 22 through the surface on which light is incident. When using a plurality of light emitting devices 100, the light emitted from different light emitting devices 100 is mixed in the light guide plate 22.

The upper surface of the light guide plate 22 serves as the light exiting surface. Positioning a given device, such as a liquid crystal panel, on the light exiting surface allows the light exited from the light guide plate 22 to travel towards the device.

The light extraction surfaces of the light emitting devices 100 and the light entering portion of the light guide plate 22 may be arranged so that their longitudinal directions coincide. Arranging the light emitting devices 100 so that the longitudinal direction of its light extraction surface is parallel with the longitudinal direction of the light entering portion of the light guide plate 22 can introduce the light from the light emitting devices 100 into the light guide plate 22 at a higher efficiency.

Figure 5B:
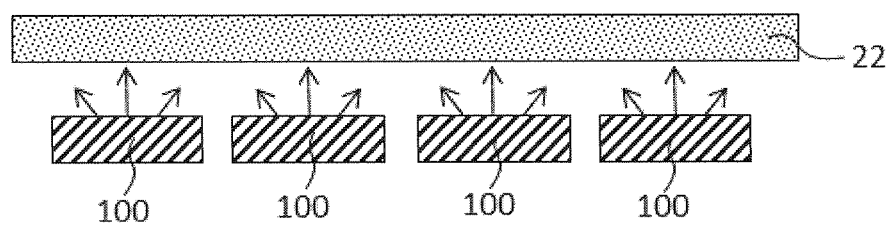
FIG. 5B is a schematic sectional view of a variation of the backlight according to the second embodiment.

FIG. 5B is a schematic cross-sectional view showing a variation of the backlight 200 according to Embodiment 2. The backlight 200, as shown in FIG. 5B, may be a so-called direct-lit backlight device in which a plurality of light emitting devices 100 are disposed directly under the light guide plate 22.

The light emitting devices according to the present disclosure can be used, for example, as backlights for liquid crystal displays.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising:
   at least three light emitting elements arranged side by side;
   one or more light transmissive members each containing a phosphor; and
   a support having a recess, wherein
      the at least three light emitting elements include two outer light emitting elements arranged on outer sides, and an inner light emitting element arranged between the two outer light emitting elements and having a different peak emission wavelength than a peak emission wavelength of the two outer light emitting elements,
      the phosphor has a longer peak emission wavelength than the peak emission wavelengths of the outer light emitting elements and the peak emission wavelength of the inner light emitting element,
      the two outer light emitting elements and the inner light emitting element are connected in series,
   the peak emission wavelength of the two outer light emitting elements is in a range from 430 nm to less than 490 nm, and the peak emission wavelength of the inner light emitting element is in a range between 490 nm and 570 nm, and wherein the inner light emitting element has a full width at half maximum of 40 nm or lower,
   an upper surface of the inner light emitting element is positioned higher than upper surfaces of the outer light emitting elements,
   a density of the phosphor contained in a portion of the one or more light transmissive members which is lower than the upper surface of the inner light emitting element is higher than that of the phosphor contained in a portion of the one or more light transmissive members which is higher than the upper surface of the inner light emitting element, in a region between the inner light emitting element and the outer light emitting elements, and
   a reflectance of the phosphor for light of the inner light emitting element is 70% or higher on average over an inner light emitting element wavelength range, and the phosphor is at least one of phosphors having a composition expressed by a general formula $A_2MF_6:Mn^{4+}$ and a phosphor having a composition expressed by $3.5MgO \cdot 0.5MgF_2GeO_2:Mn^{4+}$, where A in the general formula is at least one selected from the group consisting of K, Li, Na, Rb, Cs, and $NH_4^+$, and M in the general formula is at least one element selected from the group consisting of the elements of Group 4 and Group 14, and
   the recess is composed of a first side wall, a second side wall, a third side wall, and a fourth side wall, the first side wall and the second side wall extending along a first direction, and the third side wall and the fourth side wall extending along a second direction orthogonal to the first direction in a top view,
      wherein each of the lengths of the first side wall and the second side wall in the first direction is longer than each of the lengths of the third side wall and the fourth side wall,
      wherein the two outer light emitting elements and the inner light emitting element are mounted side by side in the recess along the first direction,
      wherein the two outer light emitting elements and the inner light emitting element have a rectangular shape in a top view, and
      wherein, in a top view, one long side of one of the two outer light emitting elements is opposite to one short side of the inner light emitting element, and one long side of another one of the two outer light emitting elements is opposite to another short side of the inner light emitting element, and all of the long sides of the two outer light emitting elements and all of the short sides of the inner light emitting element extend in parallel to the second direction.

2. The light emitting device according to claim 1, wherein the peak emission wavelength of the phosphor is in a range between 580 nm and 680 nm.

3. The light emitting device according to claim 2, wherein a ratio of a light output of the inner light emitting element to a light output of the outer light emitting elements is in a range between 0.3 and 0.7.

4. A backlight comprising:
   the light emitting device according to claim 2; and
   a light guide plate having a light-entering portion in a lateral surface, wherein
      light-extraction surfaces of the light emitting devices face the light-entering portion of the light guide plate.

5. The light emitting device according to claim 2, wherein a distance between facing lateral surfaces of the outer light emitting element and the inner light emitting element is in a range between 50 μm and 150 μm.

6. The light emitting device according to claim 2, wherein lateral surfaces of the outer light emitting elements facing the inner light emitting element are parallel to lateral surfaces of the inner light emitting element facing the outer light emitting elements.

7. The light emitting device according to claim 2, wherein the light transmissive member covers at least a portion of the outer light emitting elements and at least a portion of the inner light emitting elements.

8. The light emitting device according to claim 2, wherein the light transmissive member is disposed so as to be in contact with the outer light emitting elements and the inner light emitting element.

9. The light emitting device according to claim 1, wherein a ratio of a light output of the inner light emitting element to a light output of the outer light emitting elements is in a range between 0.3 and 0.7.

10. A backlight comprising:
the light emitting device according to claim 1; and
a light guide plate having a light-entering portion in a lateral surface, wherein
light-extraction surfaces of the light emitting devices face the light-entering portion of the light guide plate.

11. The light emitting device according to claim 1, wherein a distance between facing lateral surfaces of the outer light emitting element and the inner light emitting element is in a range between 50 μm and 150 μm.

12. The light emitting device according to claim 1, wherein lateral surfaces of the outer light emitting elements facing the inner light emitting element are parallel to lateral surfaces of the inner light emitting element facing the outer light emitting elements.

13. The light emitting device according to claim 1, wherein the light transmissive member covers at least a portion of the outer light emitting elements and at least a portion of the inner light emitting elements.

14. The light emitting device according to claim 1, wherein the light transmissive member is disposed so as to be in contact with the outer light emitting elements and the inner light emitting element.

15. The light emitting device according to claim 1, wherein, in a top view, a top surface area of the inner light emitting element is larger than each of top surface areas of the two outer light emitting elements.

\* \* \* \* \*